United States Patent
Geng et al.

(10) Patent No.: US 10,948,815 B2
(45) Date of Patent: Mar. 16, 2021

(54) MASK AND CONTROL METHOD AND USE METHOD THEREOF

(71) Applicants: Beijing BOE Optoelectronics Technology Co., Ltd., Beijing (CN); BOE TECHNOLOGY GROUP CO., LTD., Beijing (CN)

(72) Inventors: Yue Geng, Beijing (CN); Peizhi Cai, Beijing (CN); Fengchun Pang, Beijing (CN); Le Gu, Beijing (CN); Chuncheng Che, Beijing (CN)

(73) Assignees: Beijing BOE Optoelectronics Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 268 days.

(21) Appl. No.: 16/171,195

(22) Filed: Oct. 25, 2018

(65) Prior Publication Data

US 2019/0302605 A1    Oct. 3, 2019

(30) Foreign Application Priority Data

Apr. 3, 2018   (CN) .......................... 201810291456.6

(51) Int. Cl.
*G03F 1/38*     (2012.01)
*G03F 7/20*     (2006.01)
*G03F 1/50*     (2012.01)

(52) U.S. Cl.
CPC .................. *G03F 1/38* (2013.01); *G03F 1/50* (2013.01); *G03F 7/2002* (2013.01)

(58) Field of Classification Search
CPC ............. G03F 1/38; G03F 1/50; G03F 7/2002
USPC .............................................. 430/5
See application file for complete search history.

(56) References Cited

U.S. PATENT DOCUMENTS

| | | | | |
|---|---|---|---|---|
| 5,926,035 A * | 7/1999 | Raza | .................. | H03K 19/1735 326/38 |
| 6,084,656 A * | 7/2000 | Choi | .................. | G03F 7/70291 355/71 |
| 6,118,299 A * | 9/2000 | Raza | .................. | H03K 19/1735 326/39 |

* cited by examiner

*Primary Examiner* — Christopher G Young
(74) *Attorney, Agent, or Firm* — Thomas|Horstemeyer, LLP

(57) ABSTRACT

The present disclosure discloses a mask, which includes a first substrate and a second substrate. The mask further includes a polarity particle positioned between the first substrate and the second substrate. The polarity particle has a light absorption or light transmission effect. The first substrate includes a plurality of driving electrodes disposed toward the second substrate and arranged in an array. Each of the driving electrodes is configured to receive an electric signal and control the polarity particle to move to a designated driving electrode to form a pattern.

8 Claims, 3 Drawing Sheets

MASK AND CONTROL METHOD AND USE METHOD THEREOF

CROSS-REFERENCE

This application is based upon and claims priority to Chinese Patent Application No. 201810291456.6, filed on Apr. 3, 2018, the entire contents thereof are incorporated herein by reference.

TECHNICAL FIELD

The present disclosure relates to the field of display technologies, and more particularly, to a mask and a control method and a use method thereof.

BACKGROUND

Photolithographic masks have been widely used in the fields of precision manufacturing and circuit integration, for example, semiconductor device manufacturing, integrated circuit board manufacturing, and medical chip processing, etc., all of which require exposure and etching process to form target patterns by using the photolithographic masks.

SUMMARY

The present disclosure provides a mask and a control method and a use method thereof.

In a first aspect, the present disclosure provides a mask, which includes: a first substrate and a second substrate arranged oppositely, and a polarity particle positioned between the first substrate and the second substrate. The polarity particle has a light absorption or light transmission effect. The first substrate includes a plurality of driving electrodes disposed toward the second substrate and arranged in an array, and each of the driving electrodes is configured to receive an electric signal and control the polarity particle to move to a designated driving electrode to form a preset pattern.

In an arrangement, the first substrate further includes a first base arranged at a side of the driving electrode away from the second substrate, and a first dielectric layer and a first hydrophobic layer arranged at a side of the driving electrode facing toward the second substrate. The first hydrophobic layer is arranged at a side of the first substrate close to the second substrate.

The second substrate includes a second base, a reference electrode layer, a second dielectric layer and a second hydrophobic layer sequentially laminated. The second hydrophobic layer is arranged at a side of the second substrate close to the first substrate.

In an arrangement, the second substrate is provided with a through hole for injecting and sucking out the polarity particle.

In an arrangement, the first substrate and the second substrate are sealed by using a frame-sealing adhesive having a thickness of 0.1 mm-1 mm.

In an arrangement, the polarity particle is a liquid droplet having a light absorption effect, the liquid droplet has a light-absorbing substance, and a material of the light-absorbing substance includes at least one of a salicylate-based substance, a benzophenone-based substance and a benzotriazole-based substance.

In an arrangement, both the first substrate and the second substrate are transparent substrates.

In an arrangement, both a material of the first dielectric layer and a material of the second dielectric layer include at least one of silicon nitride, silicon oxide, parylene and SU-8.

A material of the first hydrophobic layer and a material of the second hydrophobic layer include at least one of Teflon and Cytop.

In a second aspect, the present disclosure further provides a control method of a mask, which is applied to the above mask. The control method includes:

inputting an electric signal to the driving electrode to control the polarity particle to move to a designated driving electrode; and maintaining the polarity particle on the designated driving electrode to form the mask having a preset pattern.

In a third aspect, the present disclosure further provides a use method of a mask, which includes:

placing the mask between a light source and a substrate where a target pattern is to be formed;

inputting an electric signal to the driving electrode of the mask to control the polarity particle to move to a designated driving electrode to form a mask having a pattern consistent with the target pattern; and exposing the substrate by means of the mask using the light source to form the target pattern on the substrate.

DETAILED DESCRIPTION

Technical solutions in the arrangements of the present disclosure will be described clearly and completely below with reference to the accompanying drawings in the arrangements of the present disclosure. Apparently, the described arrangements are some but not all of the arrangements of the present disclosure. All other arrangements obtained by a person of ordinary skill in the art based on the arrangements of the present disclosure without creative efforts shall fall within the protection scope of the present disclosure.

In the related art, masks used in photolithography process generally adopt chrome patterns formed on quartz glass, and a light shielding effect of metal patterns is used as the photolithographic masks. Because the formed metal patterns cannot be changed, it is necessary to provide a plurality of masks in a manufacture procedure requiring multiple photolithography processes. Furthermore, production procedures of different products require fabricating specially corresponding masks, and the masks cannot be applied to manufacture procedures of other products.

Fabrication processes of masks are complicated in the related art, masking patterns are unchangeable, a utilization ratio of the masks is lower, and fabrication of a plurality of masks increases costs of product manufacturing, which is disadvantageous to control of product fabrication costs.

Figure 1:
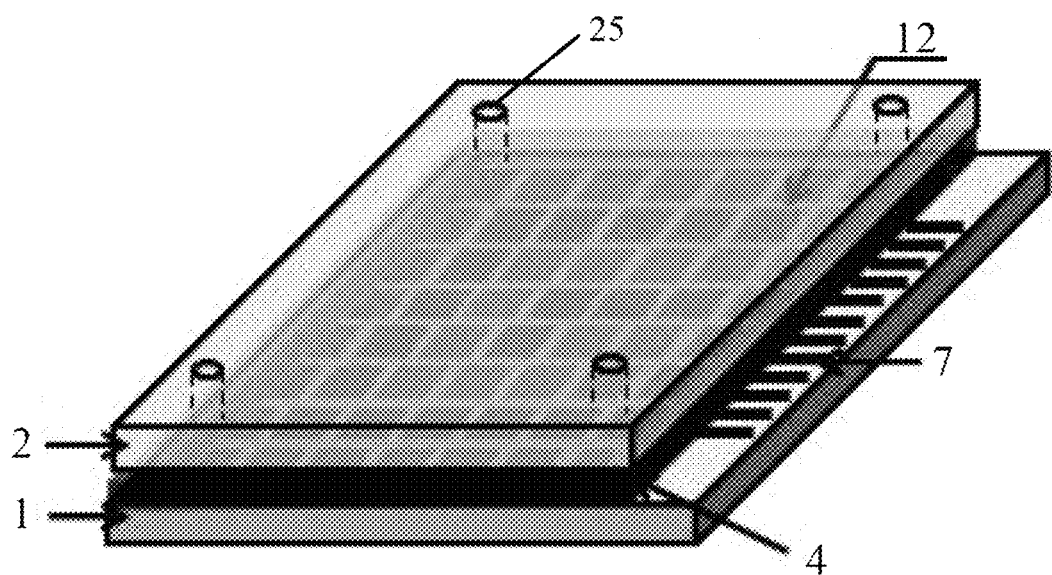
FIG. 1 illustrates a schematic structural diagram of a mask according to an arrangement of the present disclosure.
Figure 2:
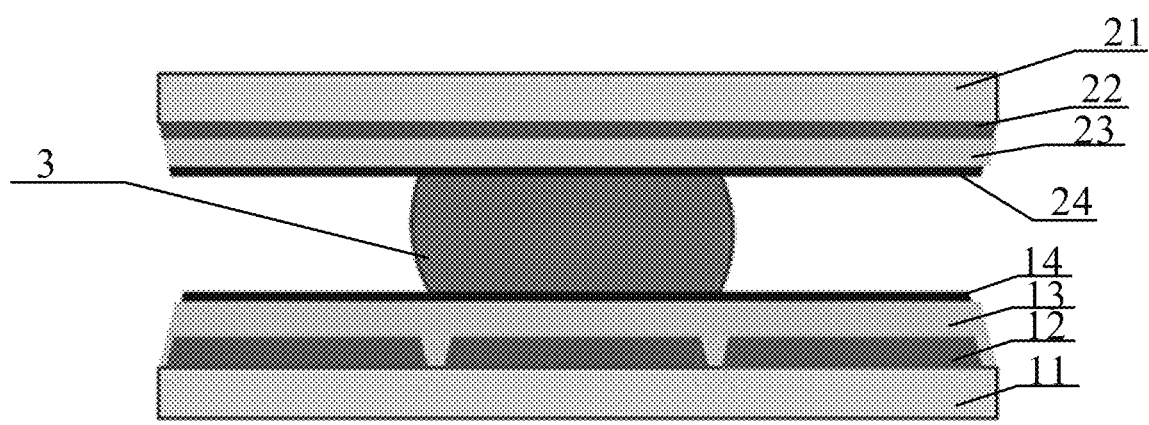
FIG. 2 illustrates a schematic structural diagram of a partial cross section of a mask according to an arrangement of the present disclosure.

Arrangements of the present disclosure provide a mask. As shown in FIG. 1 and FIG. 2, the mask includes a first substrate 1 and a second substrate 2 arranged oppositely, and a polarity particle 3 positioned between the first substrate 1 and the second substrate 2. The polarity particle 3 has a light absorption or light transmission effect.

The first substrate 1 includes a plurality of driving electrodes 12 disposed toward the second substrate 2 and arranged in an array. Each of the driving electrodes 12 is configured to receive an electric signal and control the polarity particle 3 to move to a designated driving electrode 12 to form a preset pattern.

The mask provided by the arrangements of the present disclosure includes: a first substrate and a second substrate arranged oppositely, and a polarity particle positioned between the first substrate and the second substrate. The polarity particle has a light absorption or light transmission effect. Movement of the polarity particle is controlled by means of the driving electrodes arranged in an array on the first substrate. The polarity particle may be moved to a designated region based on actual masking needs. Masking patterns are flexible and variable, a mask having different masking patterns may be formed, and effects of a plurality of masks may be implemented by using one mask. Furthermore, the mask is simple in manufacturing process. Therefore, costs of photolithography mask may be significantly reduced, and a utilization ratio of the mask may be enhanced.

According to an arrangement, to form the mask having the preset pattern, the electric signal may be applied to each of the driving electrodes 12 via an external circuit. After receiving the electric signal, the driving electrodes 12 charge or discharge. An electric field is formed due to an electric potential difference between adjacent driving electrodes 12 to drive the polarity particle 3 to move. By controlling the applied electric signal, the polarity particle 3 moves to designated driving electrodes 12 under the action of the electric field to form the mask having the preset pattern. It is to be understood that arrangement shape of the designated driving electrodes 12 is consistent with the preset pattern. The polarity particle 3 may be a positively charged particle or a negatively charged particle. Under the action of the electric field, the polarity particle 3 may move in a corresponding direction. Furthermore, the polarity particle 3 also may be a particle having a polarity such as a liquid droplet. The electric field may change a tension of contact between the liquid droplet and the substrate, and thus driving the liquid droplet to move.

It is to be understood that the polarity particle 3 positioned between the first substrate 1 and the second substrate 2 may be a polarity particle having a light absorption effect or may be a particle having a light transmission effect.

For example, when the polarity particle 3 between the first substrate 1 and the second substrate 2 is a particle having the light absorption effect, the first substrate 1 and the second substrate 2 are transparent substrates. By applying the electric signal to the driving electrodes 12, the polarity particle 3 is controlled to move to designated driving electrodes 12 to form the mask having the preset pattern, such that the polarity particle 3 on the designated driving electrodes 12 may play a role of blocking the light path, and light rays may successfully pass through other regions having no polarity particle. When the polarity particle 3 between the first substrate 1 and the second substrate 2 is a particle having the light transmission effect, the first substrate 1 and the second substrate 2 may be substrates having a light shielding effect. By applying the electric signal to the driving electrodes 12, the polarity particle 3 is controlled to move to designated driving electrodes 12 to form the mask having the preset pattern, such that the polarity particle 3 on the designated driving electrodes 12 may change transmission of light of two substrates within this region, and thus light rays may successfully pass through this region, but cannot pass through other regions having no polarity particle. Through the above mentioned way, the masking effect may be implemented.

Furthermore, the mask having the polarity particle with the light absorption effect or light transmission effect may be selected based on the size of a light shielding area. The mask having the polarity particle with the light transmission effect may be selected when it is needed that the light shielding area is greater than the light transmission area. The mask having the polarity particle with the light absorption effect may be selected when it is needed that the light shielding area is less than the light transmission area. Thus, the quantity of the polarity particles needed is relatively less, and correspondingly electric quantity required to drive the polarity particle is less. Therefore, resources are saved.

The above polarity particles 3 may be liquid droplets. Setting of the first substrate 1, the second substrate 2 and the polarity particles 3 and controlling of movement of the polarity particles 3 based on the driving electrodes 12 array-distributed on the first substrate 1 may refer to existing digital microfluidic technologies. The digital microfluidic technologies based on dielectric wetting principles can be used for accurately controlling the liquid droplets to implement spreading, movement, integration, separation and other operations of the liquid droplets.

The mask provided by the arrangements of the present disclosure includes a first substrate 1 and a second substrate 2 arranged oppositely, and a polarity particle 3 having a light absorption or light transmission effect positioned between the first substrate 1 and the second substrate 2. Movement of the polarity particle 3 is controlled by means of the driving electrodes 12 arranged in an array on the first substrate. The polarity particle 3 may be moved to the designated driving electrode based on actual masking needs. Masking patterns are flexible and variable, a mask having different masking patterns may be formed, and effects of a plurality of masks may be implemented by using one mask. Furthermore, the mask is simple in manufacturing process. Therefore, costs of photolithography mask may be significantly reduced, and a utilization ratio of the mask may be enhanced.

Reference is made below by taking an example in which the polarity particle 3 is a liquid droplet having the light absorption effect. The liquid droplet has a light-absorbing substance. Both the first substrate 1 and the second substrate 2 are transparent substrates.

Specifically, the first substrate 1 further includes a first base 11 arranged at a side of the driving electrode 12 away from the second substrate 2, and a first dielectric layer 13 and a first hydrophobic layer 14 arranged on a side of the driving electrode 12 facing toward the second substrate 2. The first hydrophobic layer 14 is arranged at a side of the first substrate 1 close to the second substrate 2. The second substrate 2 includes a second base 21, a reference electrode layer 22, a second dielectric layer 23 and a second hydrophobic layer 24 sequentially laminated. The second hydrophobic layer 24 is arranged at a side of the second substrate 2 close to the first substrate 1.

The first base 11 and the second base 21 may be glass substrates. A material of the driving electrode 12 and the reference electrode layer 22 may be a transparent electrode ITO. Specifically, the ITO may be first deposited on the first base 11 of the first substrate 1 and then is exposed and etched to form a plurality of driving electrodes 12 arranged in an array. ITO is deposited on the whole surface of the second base of the second substrate 2 to form the reference electrode layer 22. The materials of the first dielectric layer 13 and the second dielectric layer 23 specifically may be silicon nitride, silicon oxide, parylene and SU-8, etc. The materials of the first hydrophobic layer 14 and the second hydrophobic layer 24 specifically may be Teflon and Cytop, etc.

It is to be understood that the reference electrode layer 22 and the driving electrodes 12 arranged in an array are arranged oppositely, and a plurality of electric fields may be formed between the reference electrode layer 22 and the driving electrodes 12. Under the action of the electric field, the tension of the liquid droplet on the surfaces of the first dielectric layer 13 and the second dielectric layer 23 is reduced, a contact angle is reduced, and change of the tension causes unbalanced force to be acted on the liquid droplet, thus driving the liquid droplet to move. Specifically, one corresponding thin film transistor switch may be arranged for each driving electrode 12, which corresponds to at least two signal lines. The thin film transistor switch includes a control terminal, a signal input terminal, and a signal output terminal. The control terminal and the signal input terminal of the thin film transistor switch respectively connect to the two signal lines, and the signal output terminal connects to the driving electrode 12. In this way, the electric signal applied to each driving electrode 12 may be respectively controlled, and the reference electrode layer 22 may be controlled to be applied with a constant voltage signal. Of course, the reference electrode layer 22 also may be arranged into array electrodes corresponding to the driving electrodes 12 respectively. An electric field between two substrates is controlled by respectively controlling each electrode array of the reference electrode layer 22 and the driving electrode 12 to drive the liquid droplet to move. Furthermore, each driving electrode 12 may be connected to a separate signal line for controlling. There may be multiple manners for applying the electric signal to the driving electrode 12, which is not limited by the present disclosure. It is to be understood that the thin film transistor switch and the signal line may be integrated on the first substrate 1 and arranged in the same layer with the driving electrode 12, or may be positioned in other layer structures, or may be arranged on the second substrate 2 to implement an electrical connection with the driving electrode 12 via a through hole. However, the present disclosure is not limited thereto.

Specifically, the electric signal may be applied to the driving electrode 12 through an external circuit. It is to be understood that when the thin film transistor switch and the signal line are arranged on the first substrate, a plurality of wires are provided on the first substrate 1 to transmit the electric signal to the driving electrode 12. Pins 7 of these wires generally are arranged at an edge of a lateral side of the first substrate 1, such that the pins 7 may be conveniently attached to a flexible circuit board, or the electric signal may be conveniently applied from an external device.

Further, the first substrate 1 and the second substrate 2 are sealed by a frame-sealing adhesive 4, and a certain thickness of the frame-sealing adhesive 4 may form a gap between the first substrate 1 and the second substrate 2 to inject the liquid droplet. The frame-sealing adhesive 4 may have a thickness of 0.1 mm-1 mm to ensure that the liquid droplet may be positioned in sealed space formed by the two substrates.

A through hole 25 for injecting and sucking out the polarity particle 3 is provided on the second substrate 2. The through hole 25 generally is arranged within an edge region of the second substrate 2 to prevent the through hole 25 from having a negative effect on the mask pattern. The present disclosure does not limit the specific location and the number of the through holes.

According to the wavelength of an exposure light source in the photolithography process, polarity particles 3 having different light absorption effects are selected, and light-absorbing substances for absorbing light from different light sources may be injected into the polarity particles 3. For example, when the exposure light source is ultraviolet light, liquid droplets having ultraviolet light absorbing effect may be selected, and at least one of a salicylate-based substance, a benzophenone-based substance and a benzotriazole-based substance used for absorbing ultraviolet light may be dissolved in the liquid droplets. When it is required to adjust the quantity of the liquid droplets between the two substrates, the liquid droplets may be injected or sucked out from the through hole 25. When the exposure light source is replaced, the liquid droplets also may be sucked out from the through hole 25, and then the liquid droplets having light absorption effect on the exposure light source are injected. Setting of the through hole 25 makes it convenient to adjust the quantity and varieties of the liquid droplets according to actual needs.

Figure 3A:
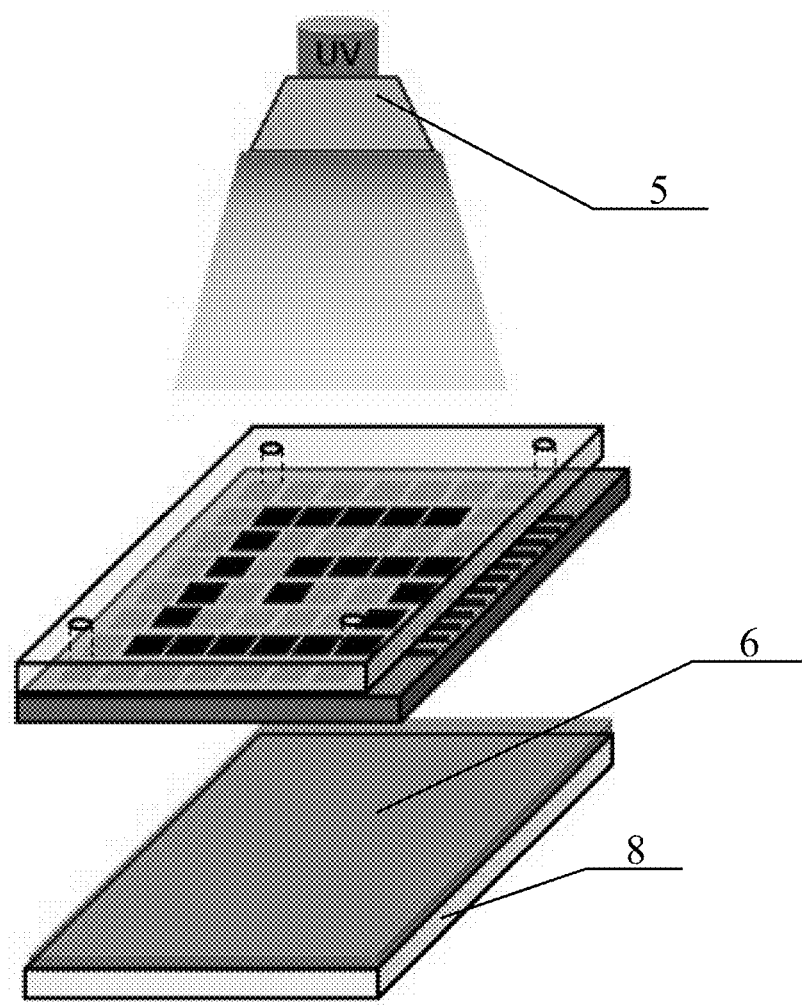
FIG. 3a and FIG. 3b illustrate schematic diagrams of forming and using a mask.
Figure 3B:
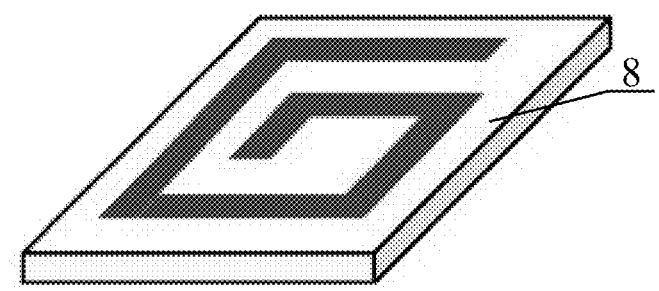

Procedures of forming and using the mask are illustrated in the following. Referring to FIG. 3a-FIG. 3b, the light source 5 may be ultraviolet light, and the photoresist 6 is a positive photoresist. To form the exposed pattern on the substrate 8 as shown in FIG. 3b, first an external electric signal is applied by a pin 7 of the first substrate 1 of the mask, and after the driving electrode 12 receives the electric signal, the polarity particle 3 such as a liquid droplet is controlled to move to and cover the fuscous driving electrodes 12 in FIG. 3a arrayed according to the preset pattern. At this moment, when the liquid droplets move onto these driving electrodes 12 arrayed according to a predesigned rule, applying the electric signals is stopped or the same electric signal is applied to each of the driving electrodes 12. The liquid droplets may be maintained on these driving electrodes 12 to form a mask having a preset pattern. Next, the mask is placed between the light source 5 and the to-be-photoetched substrate 8 coated with the photoresist 6 to serve as a photolithographic mask. After the exposure, the photoresist 6 shielded by the liquid droplets are retained, such that the photoetched pattern as shown in FIG. 3b may be formed on the substrate 8.

It is to be understood that the polarity particles 3 in the figure occupy a single row and a single column of driving electrodes 12. However, the practical application is not limited thereto. The polarity particles 3 may occupy multiple rows and multiple columns according to actual mask needs, or a plurality of polarity particles 3 may be focused on one driving electrode 12. The driving electrodes 12 in the figure are rectangular. However, the driving electrodes 12 also may be shaped like circles or triangles, etc. The exposure accuracy of the mask is related to the size of the driving electrode 12 and the size of the polarity particle 3. The smaller the driving electrode 12 and the polarity particle 3 are, i.e., the smaller the attainable minimum line width and the minimum line spacing are, the higher the control accuracy of the mask is. The driving electrodes of the mask in this arrangement may be as small as several tens of micrometers. In practical application, masks having different sizes of driving electrodes may be fabricated according to the precision of the exposed pattern.

Reference is made above merely by taking an example where the polarity particle 3 is a liquid droplet having a light absorption effect. An arrangement where the polarity particle 3 is a particle having a light transmission effect is similar to the above arrangement, and thus its detailed description is omitted here.

Figure 4:
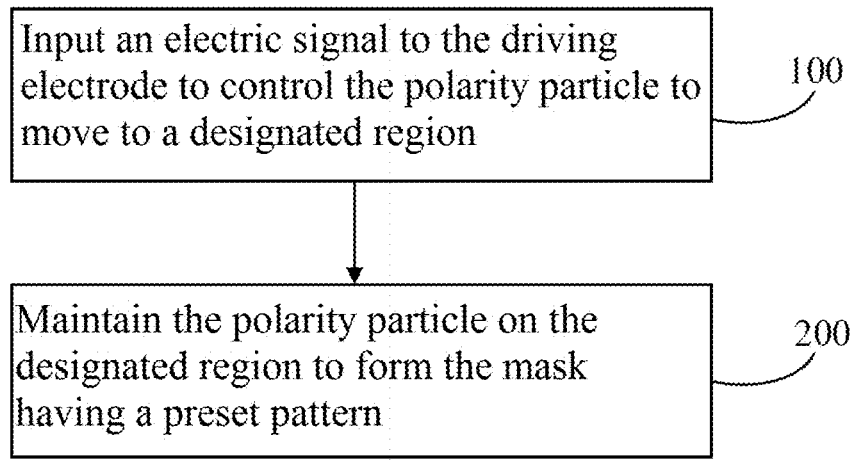
FIG. 4 illustrates a flowchart of a method for controlling a mask according to an arrangement of the present disclosure.

An arrangement of the present disclosure further provides a method for controlling a mask, which is applied to the mask in the above arrangement. Referring to FIG. 4, the control method includes following blocks.

In 100, an electric signal is inputted to the driving electrode to control the polarity particle to move to a designated driving electrode.

In 100, according to requirements for actual mask patterns, an electric signal is applied to the pin 7 of the first substrate 1 of the mask. After receiving the electric signal, the driving electrode 12 controls the polarity particle 3 to move onto and cover a designated driving electrode 12. The manner of applying an electric signal by the driving electrode 12 has been described in the foregoing arrangement, and thus is not unnecessarily elaborated herein.

In 200, the polarity particle is maintained on the designated driving electrode to form the mask having a preset pattern.

After the polarity particle 3 moves onto the designated driving electrode 12, the electric signal may not be inputted to the driving electrode 12, or the same electric signal may be applied to the respective driving electrodes, and thus the polarity particle 3 is maintained on the driving electrode to form the mask having the preset pattern. Next, the mask may be employed to perform the photolithography process.

By using the above method, movement of the polarity particle 3 may be controlled by means of the driving electrodes 12 arranged in an array. The polarity particle 3 may be moved to the designated driving electrode 12 based on actual masking needs. Masking patterns are flexible and variable, a mask having different masking patterns may be formed, and effects of a plurality of masks may be implemented by using one mask. Therefore, a utilization ratio of the mask may be enhanced.

Figure 5:
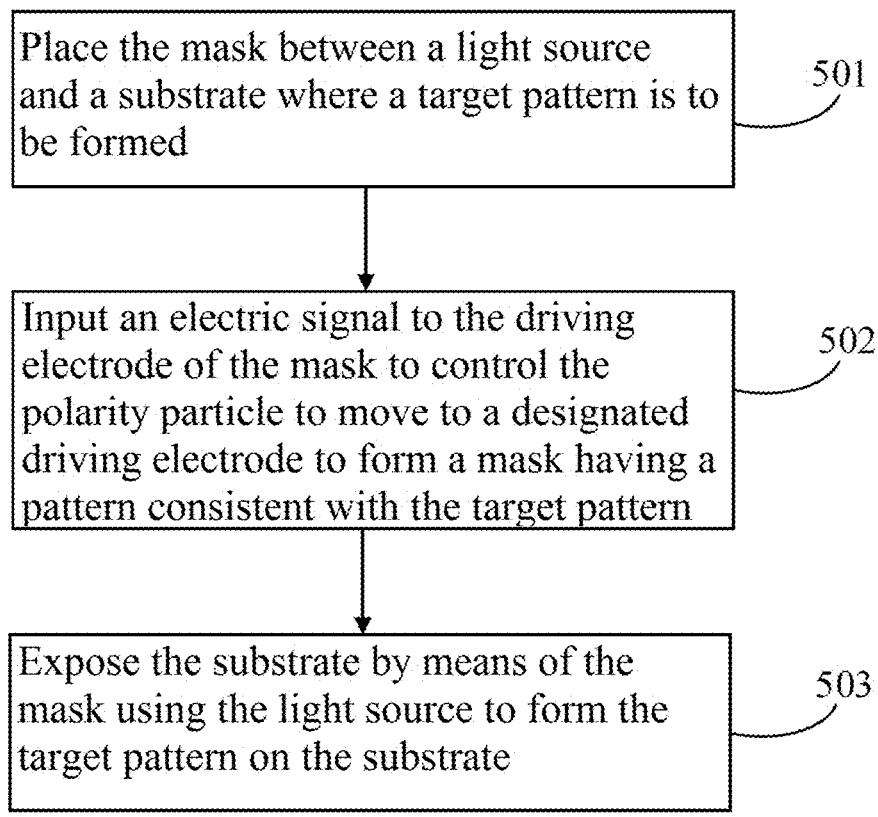
FIG. 5 illustrates a flowchart of a method for using a mask according to an arrangement of the present disclosure.

An arrangement of the present disclosure further provides a method for using a mask, the mask is the mask in the above arrangement. Referring to FIG. 5, the control method includes following blocks.

In 501, the mask is placed between a light source and a substrate where a target pattern is to be formed.

It is to be understood that in 501 the polarity particles in the mask are not arrayed based on a certain rule. The polarity particles in the mask may be selected based on the exposure light source. For example, polarity particles having a light absorption effect on the exposure light source may be selected.

For example, referring to FIG. 3a and FIG. 3b, the target pattern is the pattern to be finally formed on the substrate 8 as shown in FIG. 3b, the mask is placed between the light source 5 and the substrate 8, and then subsequent blocks are performed.

In 502, an electric signal is inputted to the driving electrode of the mask to control the polarity particle to move to a designated driving electrode to form a mask having a pattern consistent with the target pattern.

In 502, the mask having the pattern consistent with the target pattern is formed. Referring to FIG. 3a and FIG. 3b, the polarity particles 3 of the mask are formed on the fuscous driving electrodes 12 as shown in FIG. 3b, and the pattern of the polarity particles 3 on the mask is consistent with the target pattern. Procedures of specifically forming the pattern have been described in the foregoing arrangement, and thus their detailed descriptions are omitted here.

In 503, the substrate is exposed by means of the mask using the light source to form the target pattern on the substrate.

Referring to FIG. 3a, the mask having the pattern consistent with the target pattern is formed, photolithography process blocks such as exposure and developing may be performed on the substrate 8, and finally the pattern as shown in FIG. 3b is formed on the substrate 8.

The mask having the pattern consistent with the target pattern may be formed by using the above method for using a mask based on actual requirements for masking, masking patterns are flexible and variable, and a utilization ratio of the mask is enhanced.

The arrangements in the specification are described in a progressive manner. Each arrangement is focused on difference from other arrangements. And cross reference is available for identical or similar parts among different arrangements. System arrangements are basically similar to method arrangements, thus description of the system arrangements is relatively simple, and reference can be made to the description of the method arrangements for relevant parts.

Although preferred arrangements of the present disclosure are already described, once those skilled in the art understand basic creative concept, they can make additional modification and alteration for these arrangements. Therefore, the appended claims are intended to be interpreted as comprising preferred arrangements and all alterations and modifications falling within the scope of the arrangements of the present disclosure.

The abovementioned arrangements are merely specific arrangements of the present disclosure, but the protection scope of the present disclosure is not limited thereto. Any variation or substitution easily conceivable to a person of ordinary skills in the art within the technical scope disclosed in the present disclosure shall fall within the protection scope of the present disclosure. Therefore, the protection scope of the present disclosure shall be subject to that of the claims.

What is claimed is:
1. A mask, comprising:
a first substrate;
a second substrate arranged oppositely to the first substrate; and
a polarity particle positioned between the first substrate and the second substrate, wherein the polarity particle has one of a light absorption effect and light transmission effect, and wherein:
the first substrate comprises a plurality of driving electrodes disposed toward the second substrate and arranged in an array;
the polarity particle is configured to be moveable from one driving electrode to another driving electrode between the first substrate and the second substrate according to an electric signal applied to the driving electrode to form a pattern;
the first substrate further comprises a first base arranged at a first side of the plurality of driving electrodes facing away from the second substrate, and a first dielectric layer and a first hydrophobic layer arranged at a second side of the plurality of driving electrodes facing toward the second substrate, the first hydrophobic layer being arranged as a side of the first substrate close to the second substrate; and
the second substrate comprises a second base, a reference electrode layer, a second dielectric layer, and a second hydrophobic layer sequentially laminated, the second hydrophobic layer being arranged at a side of the second substrate close to the first substrate.

2. The mask according to claim 1, wherein the second substrate is provided with a through hole for injecting and sucking out the polarity particle.

3. The mask according to claim 1, wherein the first substrate and the second substrate are sealed by using a frame-sealing adhesive having a thickness of 0.1 mm-1 mm.

4. The mask according to claim 1, wherein the polarity particle is a liquid droplet having the light absorption effect, the liquid droplet has a light-absorbing substance, and a material of the light-absorbing substance comprises at least one of a salicylate-based substance, a benzophenone-based substance and a benzotriazole-based substance.

5. The mask according to claim 4, wherein both the first substrate and the second substrate are transparent substrates.

6. The mask according to claim 1, wherein:
both a material of the first dielectric layer and a material of the second dielectric layer comprise at least one of silicon nitride, silicon oxide, parylene and SU-8; and
both a material of the first hydrophobic layer and a material of the second hydrophobic layer comprise at least one of Teflon and Cytop.

7. A method for controlling a mask, comprising:
providing the mask, the mask comprising:
a first substrate;
a second substrate arranged oppositely to the first substrate; and
a polarity particle positioned between the first substrate and the second substrate, wherein the polarity particle has one of a light absorption effect and light transmission effect, and wherein:
the first substrate comprises a plurality of driving electrodes disposed toward the second substrate and arranged in an array,
the polarity particle is configured to be moveable from one driving electrode to another driving electrode between the first substrate and the second substrate according to an electric signal applied to the driving electrode to form a pattern,
the first substrate further comprises a first base arranged at a first side of the plurality of driving electrodes facing away from the second substrate, and a first dielectric layer and a first hydrophobic layer arranged at a second side of the plurality of driving electrodes facing toward the second substrate, the first hydrophobic layer being arranged as a side of the first substrate close to the second substrate, and
the second substrate comprises a second base, a reference electrode layer, a second dielectric layer, and a second hydrophobic layer sequentially laminated, the second hydrophobic layer being arranged at a side of the second substrate close to the first substrate;
inputting an electric signal to the driving electrode to control the polarity particle to move to the designated driving electrode; and
maintaining the polarity particle on the designated driving electrode to form the mask having a pattern.

8. A method for using a mask, comprising:
providing the mask, the mask comprising:
a first substrate;
a second substrate arranged oppositely to the first substrate; and
a polarity particle positioned between the first substrate and the second substrate, wherein the polarity particle has one of a light absorption effect and light transmission effect, and wherein:
the first substrate comprises a plurality of driving electrodes disposed toward the second substrate and arranged in an array,
the polarity particle is configured to be moveable from one driving electrode to another driving electrode between the first substrate and the second substrate according to an electric signal applied to the driving electrode to form a pattern,
the first substrate further comprises a first base arranged at a first side of the plurality of driving electrodes facing away from the second substrate, and a first dielectric layer and a first hydrophobic layer arranged at a second side of the plurality of driving electrodes facing toward the second substrate, the first hydrophobic layer being arranged as a side of the first substrate close to the second substrate, and
the second substrate comprises a second base, a reference electrode layer, a second dielectric layer, and a second hydrophobic layer sequentially laminated, the second hydrophobic layer being arranged at a side of the second substrate close to the first substrate;
placing the mask between a light source and a substrate where the pattern is to be formed;
inputting an electric signal to the plurality of driving electrodes of the first substrate to control the polarity particle to move to the designated driving electrode to form the pattern consistent with a target pattern; and
exposing the substrate through the mask using the light source to form the pattern on the substrate.

* * * * *